(12) United States Patent
Chen et al.

(10) Patent No.: US 6,825,534 B2
(45) Date of Patent: Nov. 30, 2004

(54) SEMICONDUCTOR DEVICE ON A COMBINATION BULK SILICON AND SILICON-ON-INSULATOR (SOI) SUBSTRATE

(75) Inventors: Howard H. Chen, Yorktown Heights, NY (US); Louis L. Hsu, Fishkill, NY (US); Li-Kong Wang, Mount Vale, NJ (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/748,256

(22) Filed: Dec. 27, 2000

(65) Prior Publication Data

US 2001/0016383 A1 Aug. 23, 2001

Related U.S. Application Data

(62) Division of application No. 09/325,732, filed on Jun. 4, 1999, now Pat. No. 6,214,653.

(51) Int. Cl.$^7$ .................. H01L 27/01; H01L 27/108
(52) U.S. Cl. .................. 257/354; 257/69; 257/70; 257/347; 257/353
(58) Field of Search .................. 257/347–354, 257/64–66, 69–70

(56) References Cited

U.S. PATENT DOCUMENTS

| | | | | |
|---|---|---|---|---|
| 4,507,158 A | * | 3/1985 | Kamins et al. | 148/175 |
| 4,837,186 A | * | 6/1989 | Ohata et al. | 438/455 |
| 4,860,081 A | * | 8/1989 | Cogan | 357/49 |
| 5,244,828 A | | 9/1993 | Okada et al. | |
| 5,258,318 A | | 11/1993 | Buti et al. | |
| 5,373,803 A | | 12/1994 | Noguchi et al. | |
| 5,399,507 A | * | 3/1995 | Sun | 437/63 |
| 5,476,809 A | * | 12/1995 | Kobayashi | 437/62 |
| 5,493,137 A | | 2/1996 | Satoh et al. | |
| 5,508,219 A | | 4/1996 | Bronner et al. | |
| 5,529,947 A | * | 6/1996 | Okonogi | 437/62 |
| 5,569,620 A | * | 10/1996 | Linn et al. | 438/406 |
| 5,585,284 A | | 12/1996 | Park | |
| 5,740,099 A | * | 4/1998 | Tanigawa | 365/51 |
| 5,759,907 A | * | 6/1998 | Assaderaghi et al. | 438/386 |
| 5,767,549 A | * | 6/1998 | Chen et al. | 257/347 |
| 5,830,784 A | | 11/1998 | Zhang et al. | |
| 5,891,763 A | | 4/1999 | Wanlass | |
| 5,930,638 A | | 7/1999 | Reedy et al. | |
| 5,956,597 A | * | 9/1999 | Furukawa et al. | 438/405 |
| 6,015,745 A | | 1/2000 | Adkisson et al. | |
| 6,051,509 A | * | 4/2000 | Tsuchiaki | 438/758 |
| 6,146,970 A | * | 11/2000 | Witek et al. | 438/424 |
| 6,190,952 B1 | * | 2/2001 | Xiang et al. | 438/155 |
| 6,214,694 B1 | * | 4/2001 | Leobandung et al. | 438/413 |

FOREIGN PATENT DOCUMENTS

| | | | | |
|---|---|---|---|---|
| JP | 10-303385 | * | 11/1998 | H01L/27/108 |
| JP | 11-97638 | * | 4/1999 | H01L/27/10 |
| JP | 11-284146 | * | 10/1999 | H01L/27/108 |

OTHER PUBLICATIONS

Neudeck, G., "A New Epitaxial Lateral Overgrowth Silicon Bipolar Transistor", IEEE Electron Device Letters, vol. EDL–8, No. 10, Oct. 1987, pp. 492–495.

Zingg, et al., "Three–Dimensional Stacked MOS Transistors by Localized Silicon Epitaxial Overgrowth", IEEE Transactions on Electron Devices, vol. 37, No. 6, Jun. 1990, pp. 1452–1461.

* cited by examiner

*Primary Examiner*—Ori Nadav
(74) *Attorney, Agent, or Firm*—Thu A. Dang, Esq.; McGinn & Gibb, PLLC

(57) ABSTRACT

A semiconductor device includes a combination substrate having a bulk silicon region, and a silicon-on-insulator (SOI) region. The SOI region includes a crystallized silicon layer formed by annealing amorphous silicon and having isolation trenches formed therein so as to remove defective regions, and isolation oxides formed in the isolation trenches.

28 Claims, 7 Drawing Sheets

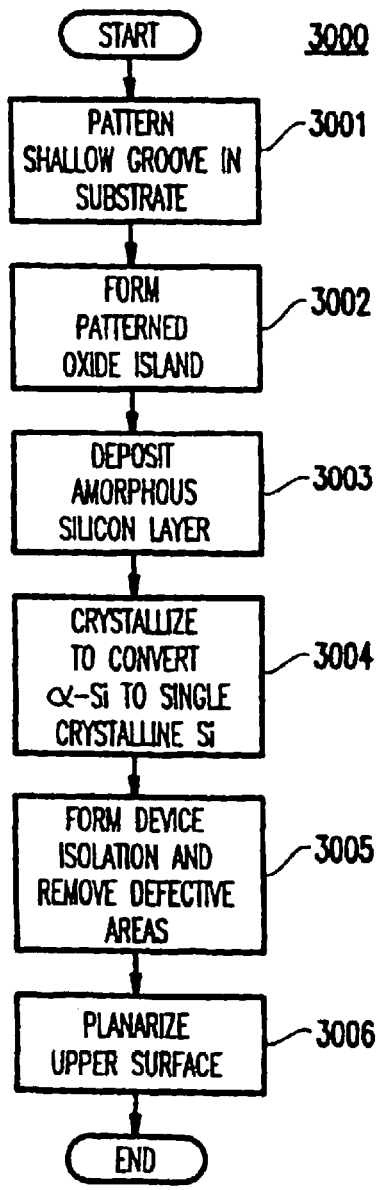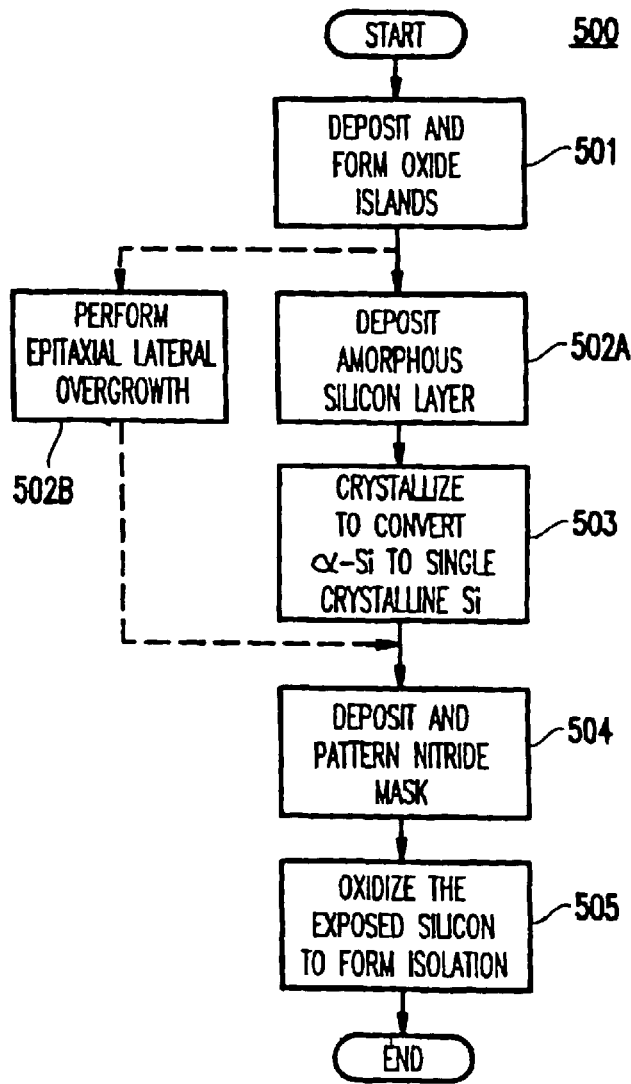

SEMICONDUCTOR DEVICE ON A COMBINATION BULK SILICON AND SILICON-ON-INSULATOR (SOI) SUBSTRATE

The present application is a Divisional application of U.S. patent application Ser. No. 09/325,732, filed on Jun. 4, 1999 now U.S. Pat. No. 6,214,653.

BACKGROUND OF THE INVENTION

1. Field of the Invention

The present invention generally relates to a method of forming a semiconductor device, and more particularly to a method of fabricating complementary metal oxide semiconductor (CMOS) devices on a mixed bulk and SOI substrate on the same chip.

2. Description of the Related Art

Using merged dynamic random access memory (DRAM) and logic technology to fabricate a system on a semiconductor chip (e.g., so-called "system-on-chip" (SOC)) has many advantages including reduction of memory latency, larger bandwidth, high-speed processing, and cost reduction.

For deep submicron CMOS logic devices, it is advantageous to build the circuits on silicon on insulator (SOI) substrate to improve the performance. However, due to the buried oxide structure and processing techniques used to form an SOI substrate, many devices cannot be built easily on the SOI substrate. For example, a large capacitor on SOI will have a difficult time making contact to the ground node. As another example, the deep trench capacitor DRAM devices, which are typically built on a bulk silicon substrate, are very difficult to integrate into the SOI substrate, as the merged DRAM/logic technology. That is, the deep trench capacitor DRAM typically cannot be built on the SOI because of the oxide barrier of the SOI which makes trench processing very complicated.

Thus, as the logic technology migrates to silicon-on-insulator (SOI) substrate technology, it becomes difficult to fabricate a DRAM that requires deep trench capacitor structures, or having a large-sized capacitor.

Additionally, thermal dissipation is poor for devices built on the conventional SOI substrate. High temperature will cause great performance degradation.

Moreover, if analog and digital devices are built on a single substrate (e.g., bulk), then high frequency noise (interference) results from the mixed signals. That is, there is no separation of noise-sensitive and noise-insensitive devices and thus the signals output therefrom are subject to interference.

SUMMARY OF THE INVENTION

In view of the foregoing and other problems of the conventional methods and structures, an object of the present invention is to provide a method for forming a mixed bulk and SOI structure.

Another object is to provide a method and structure in which complementary metal oxide semiconductor (CMOS) circuit is built strategically on a silicon-on-insulator (SOI) structure and bulk. For example, in an exemplary implementation, a high speed circuit can be built on the SOI substrate, and temperature-sensitive circuits can be fabricated on a bulk substrate. As another example, noise-sensitive circuits can be built on SOI region where the circuits are completely isolated by the oxide including the buried oxide layer, and noise-less or noise-insensitive circuits are built in the bulk structure.

Further, another object is to provide a process for merging silicon-on-insulator and bulk substrate technology on the same substrate so that the DRAM array with deep trench cells is formed on bulk and the logic device(s) is formed on SOI.

In a first aspect of the present invention, a method of forming a semiconductor device, includes patterning a groove into a bulk silicon substrate, forming an oxide in said groove and planarizing the silicon substrate to form at least one patterned oxide island in the silicon substrate, forming a silicon layer on exposed portions of the silicon substrate and the at least one oxide island, crystallizing the silicon layer using the exposed silicon substrate as a seed, the silicon substrate having direct contact with the formed silicon layer serving as a crystal growth seeding for the crystallization process, and converting the silicon layer to crystallized silicon, performing a shallow trench isolation (STI) process for device isolation as well as for removing defective regions after silicon crystallization to form the oxide isolations between devices, wherein a portion of the silicon layer above the islands is etched to form a cavity and then the same material as the islands is deposited in the cavity, and planarizing the upper surface to complete the oxide isolations. It is noted that an advantage of the present invention is that by performing the STI process also simultaneously removes the defective regions by filling the same with oxide.

In another aspect of the invention, a semiconductor device formed by the above method is provided.

Thus, according to the present invention, a method and structure are provided which produce a patterned SOI substrate where DRAM devices can be built on the bulk substrate while the logic devices (as well as the peripheral devices for the DRAM devices) are built on the patterned SOI substrate.

With the unique and unobvious features of the invention, memory circuits, for example, dynamic random access memory (DRAM) and logic technology, can be efficiently merged to fabricate an entire system on a semiconductor chip such that memory latency is reduced, bandwidth is increased, and high-speed processing and cost reduction result.

The present invention is also advantageous, for example, from a process point of view. Specifically, as compared to the conventional patterned SIMOX technique, which results in a much higher number of defect counts per unit area (or defect density), the method of the present invention results in a much better substrate quality. This higher substrate quality is because the stress from lattice mismatch (e.g., of the oxide and the silicon) is more by high energy oxygen implantation. The defective regions resulting from the method of the present invention are also predictable and therefore can be completely removed in a subsequent shallow trench formation.

BRIEF DESCRIPTION OF THE DRAWINGS

The foregoing and other purposes, aspects and advantages will be better understood from the following detailed description of preferred embodiments of the invention with reference to the drawings, in which:

FIG. 1E illustrates a defective region existing in a structure after the crystallization of the silicon on oxide in the first embodiment of the present invention;

FIG. 3 illustrates a flowchart of the method according to the first embodiment of the present invention;

FIG. 5 illustrates a flowchart of the method 500 according to the second embodiment of the present invention.

DETAILED DESCRIPTION OF PREFERRED EMBODIMENTS OF THE INVENTION

Figure 1A:
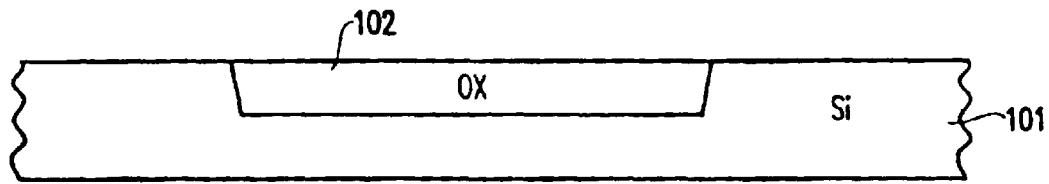
FIGS. 1A–1E illustrate a first embodiment of the method of forming a semiconductor substrate according to the present invention.

Referring now to the drawings, and more particularly to FIGS. 1A–6, there are shown preferred embodiments of the method and structures according to the present invention.

Generally, the invention is a method for forming a semiconductor device by forming a patterned "hybrid" substrate such that DRAM devices can be built on the bulk portion of the substrate, whereas logic devices (as well as the peripheral devices for the DRAM) can be built on the patterned SOI substrate. This demonstrates how a system-on-a-chip (SOC) can be easily and efficiently realized.

Referring now to FIGS. 1A–6B, a semiconductor device structure and a process of forming the semiconductor device will be described hereinbelow.

First Embodiment

FIGS. 1A–1D illustrate process of forming a substrate for mixed SOI and bulk applications according to a first embodiment of the present invention. Basically, this process shows how to form a local SOI structure in the bulk substrate including isolation and defect removal steps on the SOI silicon layer.

In FIG. 1A, a buried oxide layer 102 is processed (using the method described above) on a single crystal silicon substrate 101. Specifically, a shallow groove is formed in the silicon bulk substrate 101, and is filled with an oxide layer. Preferably, the groove has dimensions of about 2 $\mu$m to about 10 $\mu$m in width, and 1000 Å to 5000 Å in height/thickness.

Figure 1B:
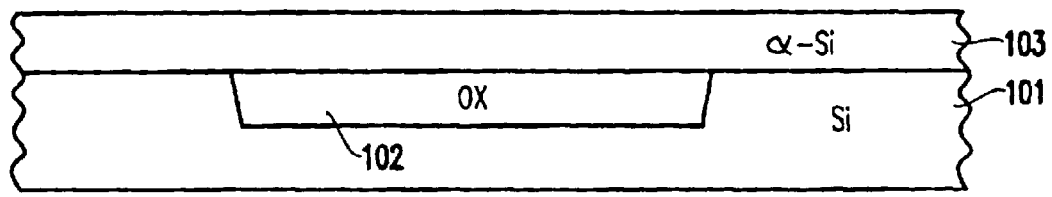

Thereafter, as shown in FIG. 1B, an amorphous silicon layer 103 is formed (e.g., deposited) over the oxide 102 and silicon layer 101.

Figure 1C:
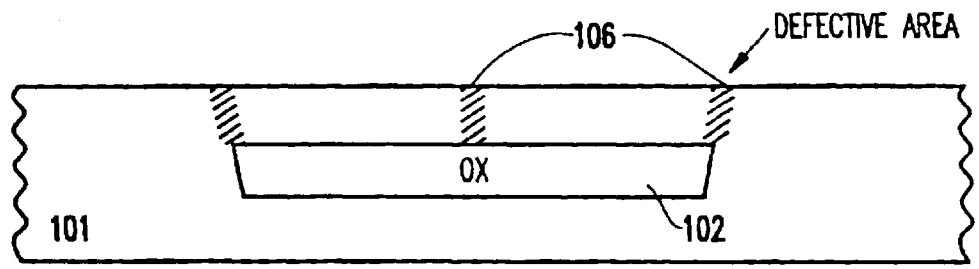

In FIG. 1C, a process is performed to crystalize the amorphous silicon layer using the single silicon crystal substrate as the seeding. Also shown areas in the crystallized layer where defects are formed.

Figure 1D:
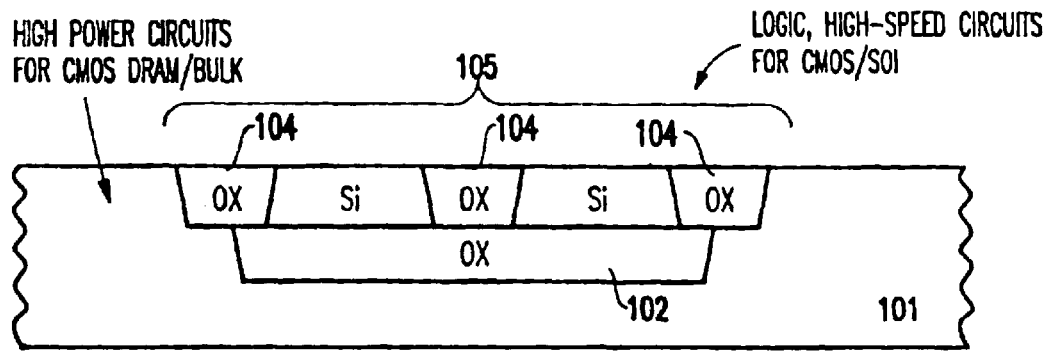

In FIG. 1D, shallow trench isolations (STIs) 104 must be placed at those locations to remove imperfect silicon on crystallized silicon layers to prevent the performance degradation due to imperfect silicon. Also used as local isolation device, those isolation areas can be placed as the CMOS device isolations without any area being wasted.

Figure 1E:
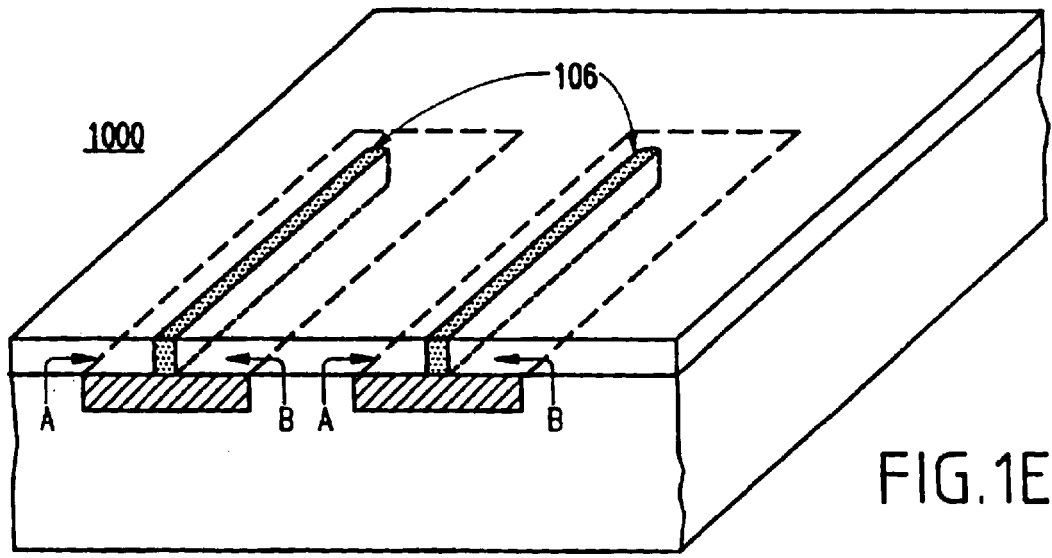

In FIG. 1E, a 3-dimensional diagram indicates the location of the defective zone after crystallization which must be removed in a following shallow trench process. After the shallow trench isolation process, the logic devices or high speed circuits are fabricated in the silicon-on-insulator region 105, whereas the memory with deep trench capacitors, or high power circuits which require high efficiency of thermal dissipating, are placed in the bulk area of the wafer.

Referring to FIGS. 2A–2F, an exemplary implementation of the first embodiment of the method of the invention will be described below. Briefly, by using a shallow trench isolation (STI) process and a silicon recrystallization process, a silicon-on-insulator (SOI) can be selectively formed on the patterned wafer substrate.

Figure 2A:
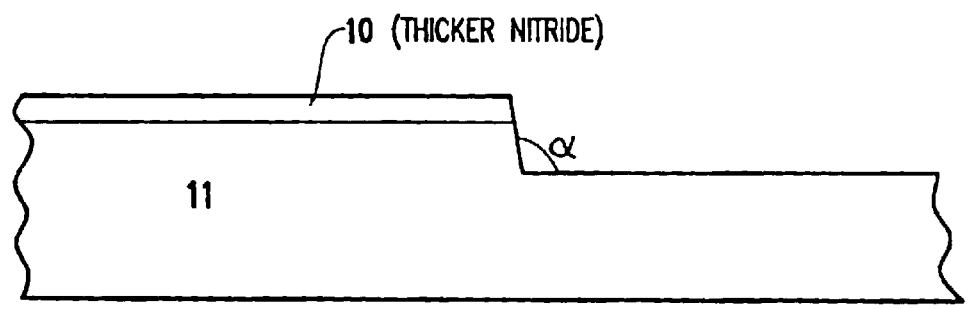
FIGS. 2A–2F illustrate an exemplary implementation of the embodiment of a process of forming the semiconductor device of FIG. 1.

First, in FIG. 2A, a groove is patterned with a nitride mask 10 and etched by well-known methods into a bulk silicon substrate 11. Preferably, the groove has a depth substantially within a typical range of about 1000 Å to about 5000 Å, and more preferably 1500 Å. The groove has a preferred sidewall angle $\alpha$ of approximately 103° to reduce the sharp corner stress.

Figure 2B:
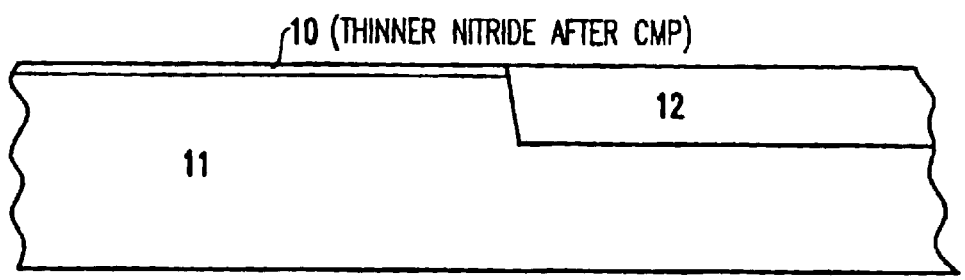

Subsequently, by using a shallow trench oxide fill and a chemical mechanical polishing (CMP) process with nitride mask 10 as a polish stop layer that is commonly used in the silicon processing technology and known by those of ordinary skill in the art, the silicon substrate surface is planarized to form patterned oxide islands 12, as shown in FIG. 2B.

Figure 2C:
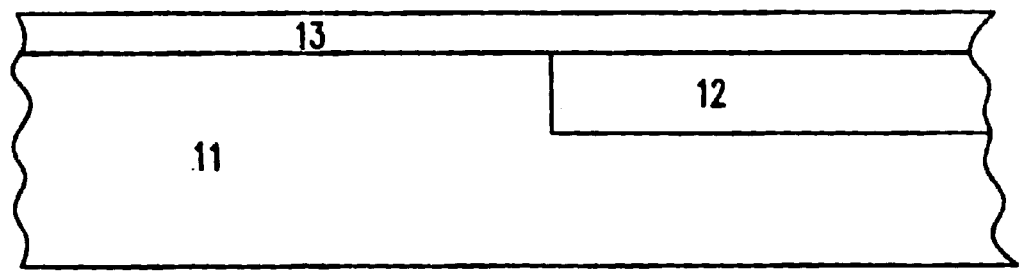

As shown in FIG. 2C, after the mask layer 10 is removed, a layer of poly-crystalline silicon or amorphous silicon 13 is formed (e.g., deposited or grown) on this substrate (e.g., on top of the silicon substrate 11 and the islands 12). If polycrystalline silicon is used, then an amorphousizing implant by high energy ion implant is required to convert the polysilicon into amorphous silicon for a later recrystallization process. Silicon layer 13 preferably has a thickness substantially within a range of about 500 Å to about 3000 Å, and more preferably about 1000 Å.

Figure 2D:
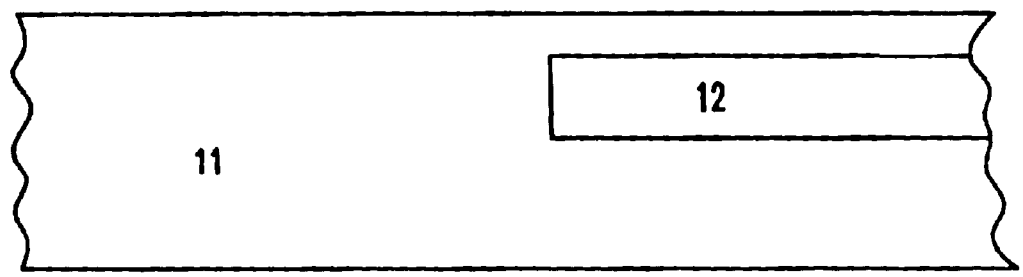

As shown in FIG. 2D, the deposited silicon layer 13 is subsequently crystallized through the utilization of a thermal annealing procedure or other forms of crystallization process, such as laser annealing or thermal annealing process, to make the top layer become crystallized. Known techniques can be used for the thermal annealing process. Further, other processes can be advantageously used.

The bottom single crystal silicon 11 which has direct contact with the deposited silicon film 13 serves as the crystal growth seeding for the crystallization process, and converts the top amorphous silicon 13 to become crystallized silicon 11. Thus, the crystal orientation and structure follow the underlying substrate (e.g., of layer 11).

Figure 2E:
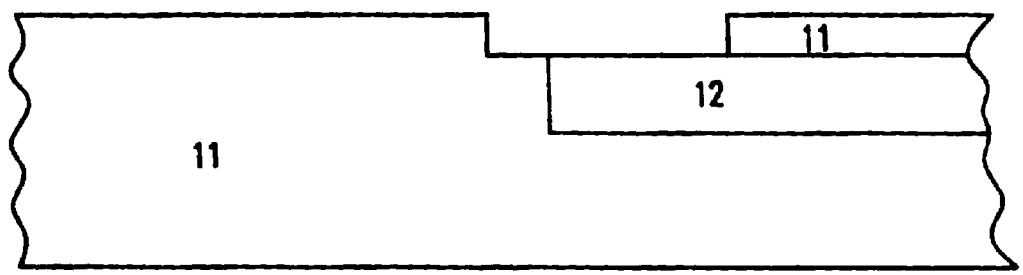
Figure 2F:
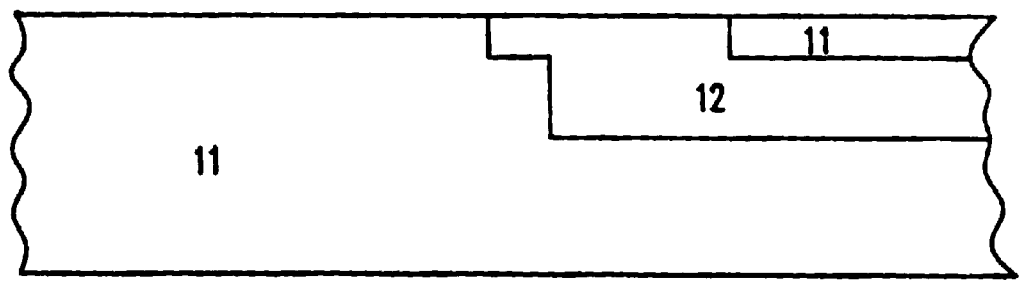

After the crystallization process, a shallow trench isolation (STI) process, as shown in FIGS. 2E–2F, is performed to form the oxide isolations between devices. Briefly, a portion of the silicon layer above the islands 12 is etched with another nitride masking layer (not shown in the drawings) to form a cavity, and then the same material as islands 12 is deposited in the cavity 12A and chemical-mechanical polished to the nitride surface. Thereafter, the upper surface is planarized to complete the oxide isolations.

However, the crystallization of silicon on oxide will not be free of defects. The silicon layer on the oxide islands 12 can have a near ideal crystal structure in this epitaxial process from the seeding single crystal silicon 11 of the bulk silicon nearby. Non-ideal silicon structures exist near the oxide island edges, as well as on the seam where the crystallization of the epitaxial silicon from both edges meet.

For example, as shown in FIGS. 1C and 1E, a structure is shown having a defective region 106. Moreover, an overgrowth direction is shown by arrows A, B in FIG. 1E. This defect region (and its removal) has been described, for example, in several publications where several recrystallization methods are described. The defective region is collected in the middle and may be removed, for example, by reactive ion etching (RIE) or the like. The process of removal defect is done at the same time with one mask when the shallow trench isolations are formed.

Among those processes, a high temperature process (e.g. furnace annealing or scanning the wafer surface with a heating element) or laser irradiation can be used to melt and re-crystallize the silicon on the oxide island 12.

Additionally, as described in "A New Epitaxial Lateral Overgrowth Silicon Bipolar Transistor", G. Neudeck, *IEEE Electron Device Letters*, Vol. EDL-8, No. 10, October 1987, and "Three Dimensional Stacked MOS Transistors by Localized Silicon Epitaxial Overgrowth", Zingg et al., *IEEE Transactions on Electron Devices*, Vol. 37, No. 6, June 1990, other techniques may be selectively employed such as low temperature selective epitaxy and epitaxial lateral overgrowth.

Figure 2G:
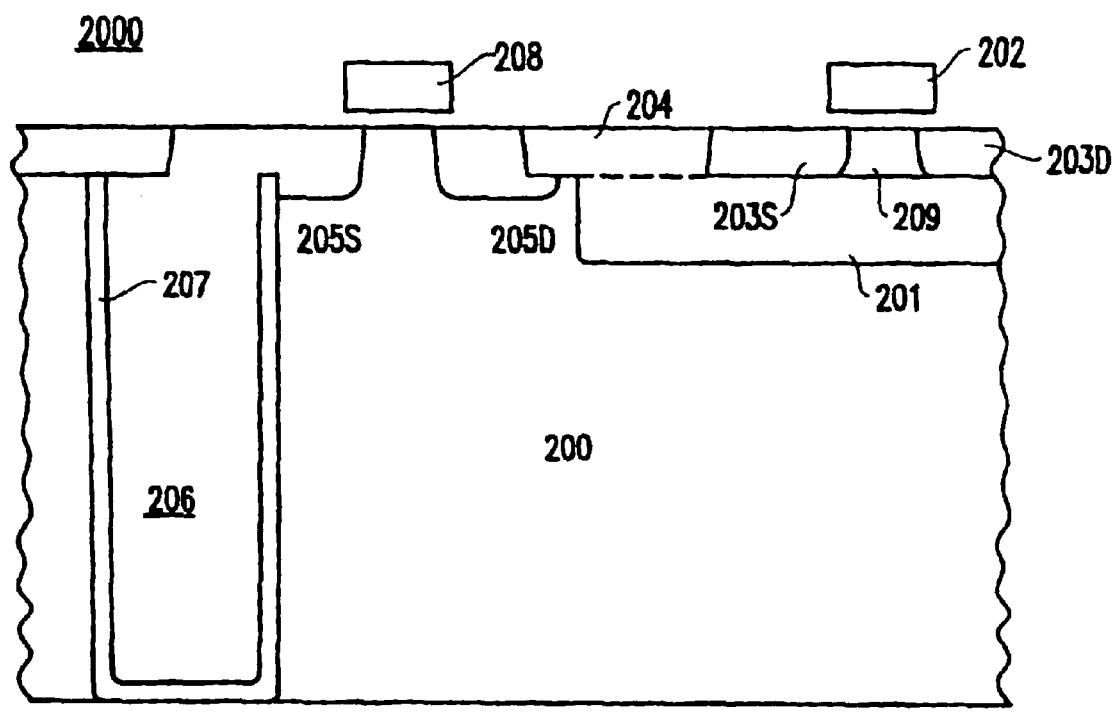
FIG. 2G illustrates a cross-section of an exemplary semiconductor device formed according to the exemplary implementation of FIGS. 2A–2F (that is, a deep trench DRAM cell is in the bulk and a peripheral device(s) is on the SOI)

FIG. 2G illustrates a cross-section of an exemplary fabricated semiconductor device 2000 according to the method of the present invention shown in FIGS. 1A–1D.

The semiconductor structure 2000 includes a bulk silicon substrate 200 together with an isolation oxide 204, a buried oxide 201 for the SOI substrate with a metal oxide semiconductor field effect transistor (MOSFET) device, which forms the source/drain 203S, 203D, a channel 209, a gate 202, and also a bulk MOSFET device for the DRAM, which includes the source/drain 205S, 205D, a gate 208 and a deep trench storage capacitor 206, built on the bulk substrate 200. The deep trench capacitor 206 has a node dielectric 207. The processing details are described above, with regard to FIGS. 1A–1E.

FIG. 3 illustrates a flowchart 3000 of the above-described process according to the first embodiment of the application. Specifically, in step 3001, the groove is patterned and etched into the bulk silicon substrate.

In step 3002, the silicon substrate surface is planarized, by using a shallow groove oxide fill and a chemical mechanical polishing (CMP) process, to form patterned oxide islands.

In step 3003, a layer of amorphous silicon is formed (e.g., deposited) on the substrate (e.g., on top of the silicon substrate and the islands).

In step 3004, the formed (deposited) silicon layer 13 is subsequently crystallized through the utilization of a thermal annealing procedure or other forms of crystallization process, such as laser annealing or thermal annealing process, to make the top layer become crystallized.

In step 3005, after the crystallization process, a shallow trench isolation (STI) process is performed to form the oxide isolations between devices. Such a process may include etching a portion of the silicon layer including high defect density zones above the islands to form a cavity, and then the same material as islands is deposited in the cavity.

In step 3006, the upper surface is planarized to complete the oxide isolations.

Thus, with the method and structure of the first embodiment, a semiconductor structure can be built having merged DRAM and logic technology on a single substrate.

Second Embodiment

Referring to FIGS. 4A–4D, a method according to a second embodiment of the present invention will be described. A difference between the second embodiment is not planarized as in the first embodiment, and thus is not believed to be as preferred as the first embodiment. However, processing costs are reduced with the second embodiment.

Figure 4A:
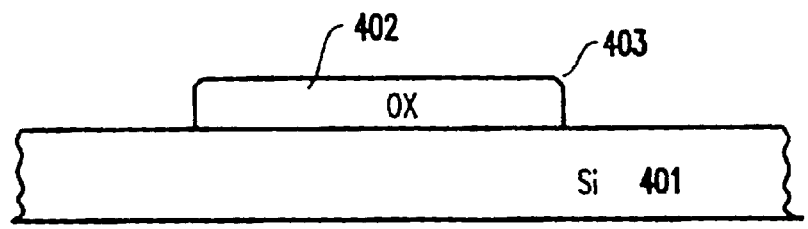
FIGS. 4A–4D illustrate a second embodiment of the method of forming a semiconductor substrate according to the present invention.

In FIG. 4A, a dielectric (e.g. oxide, nitride) 402 is deposited to a thickness of about 500 Å to about 3000 Å, and more preferably to about 1000 Å. Then, the dielectric 402 is patterned through a dry etch or the like. The corner of the patterned dielectric is rounded by dipping in a buffered hydrofluoric (BHF) solution. The rounded corner of the dielectric layer will improve the silicon quality later in the subsequent lateral over-grown epitaxial process.

Figure 4B:
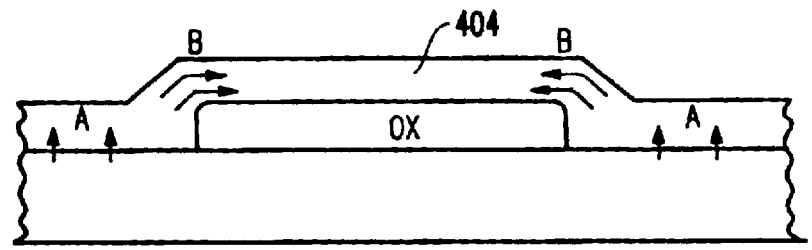

As shown in FIG. 4B, an epitaxial lateral over growth is performed in a manner known in the art. Arrow A shows the vertical growth and arrows B illustrate the horizontal epitaxial growth direction.

Figure 4C:
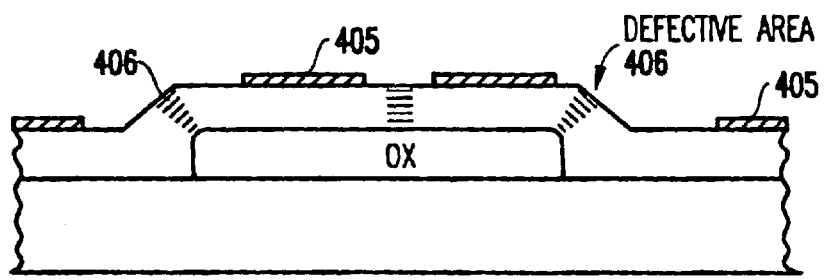

As shown in FIG. 4C, a pattern isolation operation is performed with a thin masking level, e.g., nitride 405, to form an isolation while removing the defective area 406.

Figure 4D:
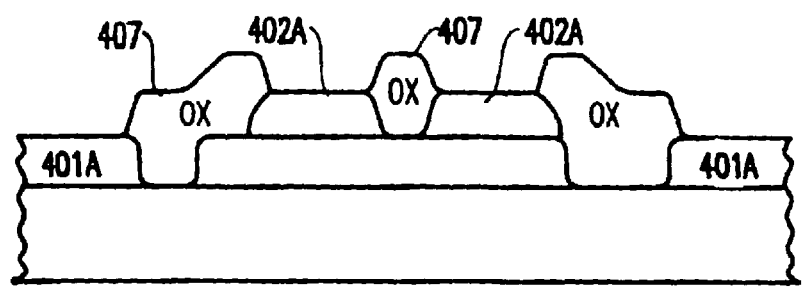

As shown in FIG. 4D, a thermal oxide is grown to consume the silicon in the exposed area 407. The remaining silicon area 402A forms the SOI structure, and the remaining area 401A forms the bulk structure.

FIG. 5 illustrates a flowchart of the above method 500 shown in FIGS. 4A–4D of the invention and which can be applied to form a mixed bulk and SOI CMOS device.

Specifically, in step 501, the buried oxide layer is processed on the single crystal silicon substrate by depositing a dielectric and patterning it in the silicon substrate.

Thereafter, in step 502A, the amorphous silicon layer is formed (e.g., deposited) over the oxide and the silicon wafer surface.

In step 503, the amorphous silicon layer is converted to single crystalline silicon by an annealing process. An alternative method is through step 502B, as shown in FIG. 5, by an epitaxial lateral overgrowth process in which a single crystal silicon can be formed on top of the dielectric film by lateral overgrowth from the exposed Si substrate.

In step 504, the silicon surface is patterned with a nitride mask, and in step 505 the exposed silicon surfaces are oxidized including those locations to remove imperfect silicon on insulator layers to prevent the performance degradation due to imperfect silicon.

The logic device are fabricated in the silicon-on-insulator region, to complete the process.

Figure 6A:
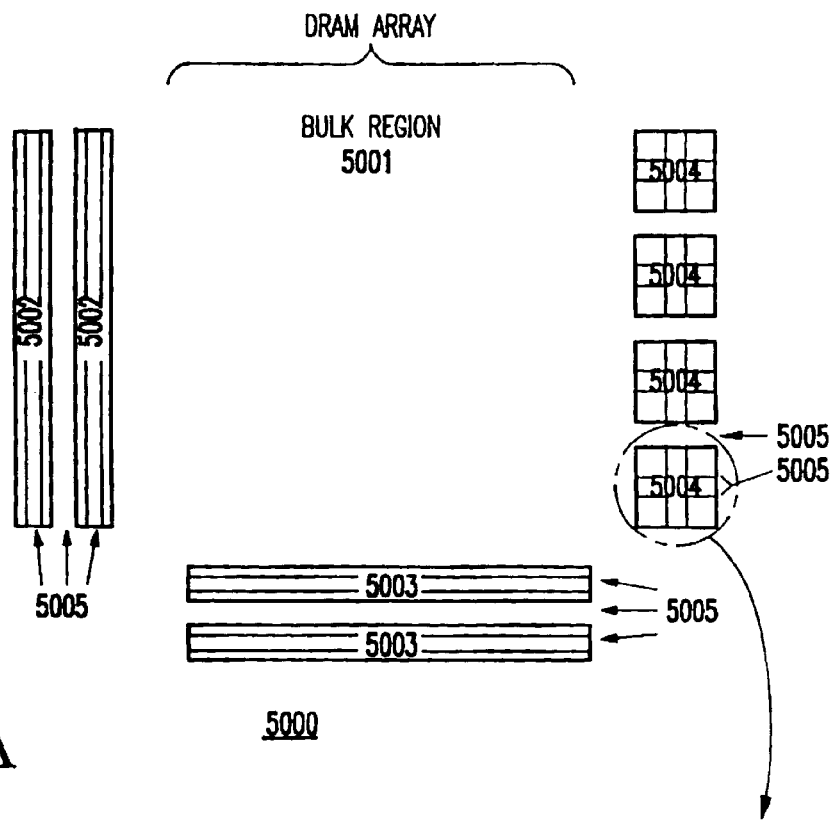
FIGS. 6A–6B illustrates a layout of a semiconductor chip 5000 in which the DRAM array is on a bulk silicon area of the chip, whereas logic devices are formed on SOI areas of the chip.
Figure 6B:
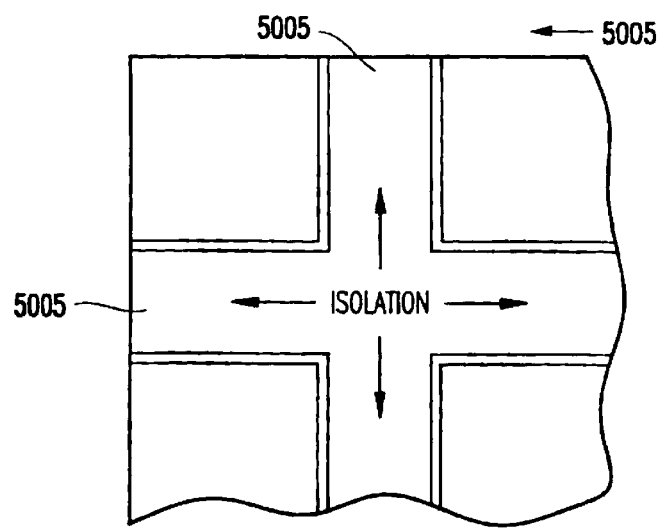

In terms of the layout arrangement using DRAM memory array as an example, a memory array device (as shown in FIGS. 6A and 6B), is placed in the bulk silicon region 5001. While the logic devices require using SOI, structures are placed in the strips of SOI islands 5002, 5003, 5004 which are isolated by the shallow trench isolation regions 5002. The logic devices may, for example, be P-FET and N-FET devices. In an exemplary layout, in region 5002 may be located a row decoder and word line driver circuits, etc. In region 5003, a column decoder circuit, a sense-amplifier circuit, etc. may be positioned, wherein an input/output (I/O) circuit, etc. may be located in region 5004.

With the present invention, a process of fabricating a patterned SOI substrate is provided. The technique can be used for mixed bulk and SOI devices where mixed applications (e.g. merged logic and DRAM CMOS technology), as well as some other technologies where several different kinds of devices must be merged together on the same chip (e.g., mixed signal processing circuitry), digital and analog CMOS using different power supply voltages are required, and high voltage devices where devices with a higher power supply voltage (e.g., from about 3V to about 15V) are used.

In the present invention, shallow trench isolations serve both as the isolation between devices and also to remove the crystallization defect. This is a key feature of the invention and provides many advantages. Thus, high performance logic circuits (e.g., low voltage, low power circuits having a voltage of, for example, about 1V or less, or higher performance digital circuits operating at, for example, above about 300 MHz clock rate) can be fabricated on the SOI substrate together with other devices such as an analog circuit, a memory array, high power circuits (e.g., from about 3V to about 15V), etc. (e.g., DRAM, DRAM, EEPROM, flash-ROM, F-RAM, etc.) which require the bulk silicon substrate.

Indeed, according to the present invention, a method and structure are provided which produce a patterned SOI substrate where DRAM devices can be built on the bulk substrate while the logic devices (as well as the peripheral devices for the DRAMs) are built on the patterned SOI substrate.

With the unique and unobvious features of the invention, dynamic random access memory (DRAM) and logic technology can be efficiently merged to fabricate an entire system on a semiconductor chip such that memory latency is reduced, bandwidth is increased, and high-speed processing, cost reduction, and better thermal dissipation result.

While the invention has been described in terms of several preferred embodiments, those skilled in the art will recognize that the invention can be practiced with modification within the spirit and scope of the appended claims.

For example, the invention could be modified to implement a SiGe epitaxial process to form islands with SiGe, or other III-V compounds, to mix silicon with other semiconductor or conductive materials on an insulator.

What is claimed is:

1. A semiconductor device comprising:
   a bulk silicon region comprising single crystal silicon; and
   a silicon-on-insulator (SOI) region comprising:
      an insulator layer which is formed beneath an upper portion of said single crystal silicon and has at least one lateral end portion adjacent to a lower portion of said single crystal silicon; and
      at least one isolation oxide formed in said upper portion of said single crystal silicon so as to form at least one island of said single crystal silicon on an upper surface of said insulator layer,
   wherein said at least one isolation oxide comprises a first isolation oxide formed adjacent to a first end portion of said insulator layer, a second isolation oxide formed adjacent to a second end portion of said insulator layer and a third isolation oxide formed on a middle portion of said insulator layer, said first and second isolation oxides extending laterally beyond said first and second end portions, respectively.

2. The semiconductor device according to claim 1, wherein said at least one island of single crystal silicon comprises a plurality of islands and said at least one isolation oxide comprises a plurality of isolation oxides, and each of said island are interspaced between said isolation oxides to form a shallow trench isolation (STI) structure.

3. The semiconductor device according to claim 2, wherein said insulator layer has a thickness in a range of 1000 Å and 5000 Å.

4. The semiconductor device according to claim 1, wherein said upper portion of said single crystal silicon is formed over said insulator layer by depositing amorphous silicon on said insulator layer and said lower portion of said single crystal silicon, and crystallizing said amorphous silicon by using said lower portion of said single crystal silicon as a crystal growth seed.

5. The semiconductor device according to claim 4, wherein said isolation oxides are formed in defective portions of said single crystal silicon.

6. The semiconductor device according to claim 3, wherein said isolation oxides and said insulator layer are formed of a same material.

7. The semiconductor device according to claim 1, wherein an upper surface of said isolation oxides and said single crystal silicon are planarized.

8. The semiconductor device according to claim 1, wherein a sidewall of said insulator layer is angled so that a width of said upper surface of said insulator layer is larger than a width of a lower surface of said insulator layer.

9. The semiconductor device according to claim 1, further comprising:
   a memory device formed in said bulk silicon region; and
   a logic device formed in said SOI region.

10. The semiconductor device according to claim 9, wherein said memory device comprises at least one of a dynamic random access memory (DRAM) device, a memory array, a static random access memory (SRAM) device, a flash memo device, a high voltage, high power circuit, and an analog circuit.

11. The semiconductor device according to claim 9, wherein said logic device comprises at least one of a logic circuit, a P-FET device, an N-FET device, a low voltage, low power circuit, and a high performance digital circuit.

12. A hybrid bulk silicon and silicon-on-insulator (SOI) substrate, comprising:
   an insulator layer which is formed beneath an upper portion of single crystal silicon and on a lower portion of said single crystal silicon; and
   a plurality of isolation oxides formed in said upper portion of said single crystal silicon so as to form at least one island of said single crystal silicon on an upper surface of said insulator layer,
   wherein said plurality of isolation oxides comprises a first isolation oxide formed adjacent to a first end portion of said insulator layer, a second isolation oxide formed adjacent to a second end portion of said insulator layer and a third isolation oxide formed on a middle portion of said insulator layer, said first and second isolation oxides extending laterally beyond said first and second end portions, respectively.

13. The hybrid substrate according to claim 12, where said insulator layer is formed in an SOI region of said substrate and not in a bulk silicon region of said substrate.

14. The hybrid substrate according to claim 13, wherein said substrate is part of a semiconductor device comprising a logic device formed in said silicon-on-insulator (SOI) region.

15. The hybrid substrate according to claim 13, wherein said substrate is part of a semiconductor device comprising a memory device formed in said bulk silicon region.

16. A semiconductor device comprising:
   a bulk semiconductor region comprising semiconductor substrate; and
   a semiconductor-on-insulator region comprising:
      an insulator layer which is formed beneath an upper portion of said semiconductor substrate and has at least one lateral end portion adjacent to a lower portion of said semiconductor substrate; and
      at least one isolation oxide formed in said upper portion of said semiconductor substrate so as to form at least one island of said semiconductor substrate on an upper surface of said insulator layer,
   wherein said at least one isolation oxide comprises a first isolation oxide formed adjacent to a first end portion of said insulator layer, a second isolation oxide formed adjacent to a second end portion of said insulator layer and a third isolation oxide formed on a middle portion of said insulator layer, said first and second isolation oxides extending laterally beyond said first and second end portions, respectively.

17. A semiconductor device comprising:

a single crystal silicon substrate having a lower portion and an upper portion;

an insulator layer which is formed beneath said upper portion of said single crystal silicon substrate and on said lower portion of said single crystal silicon substrate; and at least one isolation oxide formed in said upper portion of said single crystal silicon substrate so as to form at least one island of said single crystal silicon substrate on an upper surface of said insulator layer, wherein said at least one isolation oxide comprises a first isolation oxide formed adjacent to a first end portion of said insulator layer, a second isolation oxide formed adjacent to a second end portion of said insulator layer and a third isolation oxide formed on a middle portion of said insulator layer, said first and second isolation oxides extending laterally beyond said first and second end portions, respectively.

18. The semiconductor device according to claim 17, wherein said upper portion of said single crystal silicon substrate is formed on said insulator layer by growing said single crystal silicon substrate horizontally over said insulator layer.

19. The semiconductor device according to claim 17, wherein said upper portion of said single crystal silicon is formed by depositing amorphous silicon on said insulator layer and said lower portion of said single crystal silicon substrate, annealing said amorphous silicon so that, using said lower portion of said single crystal silicon substrate as a crystal growth seed, said amorphous silicon is converted to single crystal silicon having a same orientation as said lower portion of said single crystal silicon substrate.

20. The semiconductor device according to claim 19, wherein said isolation oxides are formed by forming isolation trenches in defective portions of said upper portion of said single crystal silicon, and depositing oxide in said isolation trenches.

21. The semiconductor device according to claim 1, wherein an angle between a bottom surface of said insulator layer and a sidewall of said insulator layer is about 103°.

22. The semiconductor device according to claim 1, wherein a crystal orientation and structure of said upper portion of said single crystal silicon follows a crystal orientation and structure of said lower portion of said single crystal silicon.

23. The semiconductor device according to claim 1, wherein said upper portion of said single crystal silicon comprises crystallized amorphous silicon.

24. The semiconductor device according to claim 1, wherein said insulator layer has a width in a range of about 2 $\mu$m to 10 $\mu$m.

25. The semiconductor device according to claim 1, wherein said upper portion of said single crystal silicon has a thickness in a range of about 500 Å to 3000 Å.

26. The semiconductor device according to claim 2, wherein said plurality of islands of single crystal silicon are wholly formed on said insulator layer.

27. The semiconductor device according to claim 1, wherein said at least one island of single silicon crystal is substantially devoid of a defective region.

28. The semiconductor device according to claim 1, wherein said first and second isolation oxides are formed at least partially on said first and second end portions, respectively.

* * * * *